United States Patent [19]

Shorrock et al.

[11] Patent Number: 5,219,801
[45] Date of Patent: Jun. 15, 1993

[54] BOROSILICATE GLASS COMPOSITION

[75] Inventors: Peter Shorrock, Wigan; Brain Yale, Ormskirk, both of United Kingdom

[73] Assignee: Pilkington PLC, Merseyside, England

[21] Appl. No.: 846,627

[22] Filed: Mar. 5, 1992

[30] Foreign Application Priority Data

Mar. 22, 1991 [GB] United Kingdom ............... 9106086

[51] Int. Cl.$^5$ .................................................. C03C 3/089
[52] U.S. Cl. .......................................... 501/65; 501/64; 501/66; 501/67; 501/905
[58] Field of Search ............... 501/58, 59, 64, 65, 501/66, 67, 905

[56] References Cited

U.S. PATENT DOCUMENTS

| | | | |
|---|---|---|---|
| 4,562,161 | 12/1985 | Mennemann et al. | 501/65 |
| 4,746,634 | 5/1988 | Danielson | 501/905 |
| 5,017,521 | 5/1991 | Yale et al. | 501/65 |
| 5,039,631 | 8/1991 | Krashkevich et al. | 501/65 |

FOREIGN PATENT DOCUMENTS

| | | |
|---|---|---|
| 1132049 | 10/1968 | United Kingdom . |
| 1280359 | 7/1972 | United Kingdom . |
| 1353935 | 5/1974 | United Kingdom . |
| 2121784 | 1/1984 | United Kingdom . |
| 2115403 | 11/1985 | United Kingdom . |

Primary Examiner—Mark L. Bell
Assistant Examiner—Deborah Jones
Attorney, Agent, or Firm—Freed, Kjeldgaard, Griffin & Inskeep

[57] ABSTRACT

A borosilicate glass composition consisting essentially of the following components:

| | |
|---|---|
| $SiO_2$ | 57–77 mol %, |
| $Al_2O_3$ | 0–8.5 mol %, |
| $B_2O_3$ | 4.6–23.0 mol %, | the total amount of $SiO_2 + Al_2O_3 + B_2O_3$ being from 81 to 91 mol %,

| | |
|---|---|
| $Li_2O$ | 0–1.5 mol %, |
| $Na_2O$ | 2–7.5 mol %, |
| $K_2O$ | 2–7.5 mol %, | the total amount of $Li_2O + Na_2O + K_2O$ being from 7.6 to 10.6 mol %,

| | |
|---|---|
| $CeO_2$ | 0.7–2.0 mol %, |
| $Sb_2O_3$ | 0–0.3 mol %, |
| $As_2O_3$ | 0–0.3 mol %, |
| $TiO_2$ | 0–2.0 mol %, |
| $F_2$ | 0–2.0 mol %, | and one or more of MgO, CaO, SrO, BaO, ZnO and PbO, in a total amount of from 0 to 7 mol %; the glass composition having a coefficient of linear expansion within the range $64.0$–$70.0 \times 10^{-7}$/deg.C.

These glass compositions are intended for use in making protective covers for gallium arsenide solar cells.

10 Claims, No Drawings

BOROSILICATE GLASS COMPOSITION

The present invention relates to borosilicate glass compositions. More particularly, the invention relates to borosilicate glass compositions which incorporate cerium oxide and which are suitable for use as protective covers for solar cells, especially solar cells constructed from gallium arsenide for use in satellites.

U.S. Pat. No. 4,746,634 describes a range of borosilicate glass compositions for use in the protection of silicon solar cells. They have coefficients of linear expansion in the range $73.5-76.7\times10^{-7}$/deg.C. In our earlier European Patent 0261885 we describe an improved range of borosilicate glass compositions having coefficients of linear expansion which match the coefficient of linear expansion of silicon.

The need to match the coefficient of linear expansion of the glass composition to that of a substrate, e.g. a silicon substrate, arises from the need to bond a protective cover made from said glass composition directly to the solar cell.

Furthermore, in order to be suitable for use in making such protective covers for solar cells, the glass compositions must be capable of being produced in the form of thin sheets of glass having a thickness of from 50 to 500 microns.

A protective cover made from such glass compositions must also exhibit the following properties:

(i) good spectral transmission with at least 80% of incident light being transmitted at 400 nm and 85% of incident light being transmitted at 450 nm (for a sample having a thickness in the range of 50 to 500 microns);

(ii) low ultra-violet light transmission i.e. high UV absorption at wavelengths below 320 nm, with less than 5% incident radiation being transmitted, more preferably less than 2% incident radiation being transmitted (for a sample having a thickness in the range of 50 to 500 microns); and (iii) absence of significant discolouration (also known as radiation stability) when exposed to solar radiation of space which comprises, inter alia, ultra-violet light, low energy electrons, protons, X-rays and gamma rays.

Solar energy cells constructed from gallium arsenide are being developed for use in space satellites. Such cells can be glazed with protective covers if made from known glass compositions provided that an adhesive layer is used to bond the protective cover to the solar cell. However, if it is desired to bond the protective cover directly to the solar cell, then the glass must have a coefficient of linear expansion which is the same as, or very close to, that of the material from which the solar cell is made.

Experiments have shown that for direct bonding to gallium arsenide, a coefficient of linear expansion of between 64.0 and $70.0\times10^{-7}$/deg.C. is required. A match of coefficient of linear expansion is particularly important for gallium arsenide because of its fragility and brittleness.

It is well known that high stability to space radiation can be achieved by the inclusion of cerium oxide in the glass composition used to form the protective cover. From about 2 to 5% by weight cerium oxide, preferably more than 3% by weight cerium oxide, is known to have the desired effect for protective covers for silicon cells. In order to be able to manufacture sheets of glass which are sufficiently thin to be suitable for use as protective covers for solar cells, it is necessary to keep the liquidus temperature of the glass composition (in relation to the viscosity of the melt) at a low value. The presence of cerium oxide at the preferred concentration range of 2 to 5% by weight generally causes the liquidus temperature of the glass to be increased above the liquidus temperature of the cerium-free base glass composition. This is particularly true when the glass composition contains a high proportion of the more acidic network-forming oxides such as $SiO_2$ or $B_2O_3$ or $Al_2O_3$. Unfortunately, to prevent the coefficient of linear expansion from rising above the desired upper limit of $70.0\times10^{-7}$/deg.C. it is necessary to work with glass compositions which contain relatively high concentrations of these acidic oxides and this can lead to glass compositions which have relatively high, undesirable, liquidus temperatures.

We have found a narrow range of borosilicate glass compositions which have the desired radiation stability and light transmission, a coefficient of linear expansion within the desired range and which also have liquidus temperatures which are sufficiently low in relation to the viscosity of the melt to make the glass compositions suitable for the manufacture of sheets of glass which are sufficiently thin for use as protective covers for solar cells made of gallium arsenide.

According to a first aspect of the present invention, there is provided a borosilicate glass composition characterised in that the glass composition consists essentially of the following components:

| | |
|---|---|
| $SiO_2$ | 57-77 mol %, |
| $Al_2O_3$ | 0-8.5 mol %, |
| $B_2O_3$ | 4.6-23.0 mol %, | the total amount of $SiO_2+Al_2O_3+B_2O_3$ being from 81 to 91 mol %,

| | |
|---|---|
| $Li_2O$ | 0-1.5 mol %, |
| $Na_2O$ | 2-7.5 mol %, |
| $K_2O$ | 2-7.5 mol %, | the total amount of $Li_2O+Na_2O+K_2O$ being from 7.6 to 10.6 mol %,

| | |
|---|---|
| $CeO_2$ | 0.7-2.0 mol %, |
| $Sb_2O_3$ | 0-0.3 mol %, |
| $As_2O_3$ | 0-0.3 mol %, |
| $TiO_2$ | 0-2.0 mol %, |
| $F_2$ | 0-2.0 mol %, | and one or more of MgO, CaO, SrO, BaO, ZnO and PbO, in a total amount of from 0 to 7 mol %; and in that the glass composition exhibits a coefficient of linear expansion within the range $64.0-70.0\times10^{-7}$/deg.C.

In a particularly preferred group of glass compositions in accordance with the invention the amounts of $SiO_2$, $Al_2O_3$ and $B_2O_3$ fall in the following ranges:

| | |
|---|---|
| $SiO_2$ | 65-70 mol %, |
| $Al_2O_3$ | 0-2 mol %, |
| $B_2O_3$ | 8-22 mol %. |

Cerium may be introduced as either the oxidised ceric form ($CeO_2$—often referred to as ceric oxide) or as the reduced cerous form ($Ce_2O_3$). In the glass both oxide forms are often present, regardless of how the cerium is added, but the reduced cerous form $Ce_2O_3$ generally predominates.

However, because ceric oxide ($CeO_2$) is the most common source of cerium, it is common practice to express cerium contents as if all the cerium is present as $CeO_2$.

Advantageously, the quantities of MgO, CaO, SrO, BaO, ZnO, PbO in the glass compositions of the invention fall within the following ranges:

| | |
|---|---|
| MgO | 0–5 mol %, |
| CaO | 0–3.5 mol %, |
| SrO | 0–2 mol %, |
| BaO | 0–2 mol %, |
| ZnO | 0–2.5 mol %, |
| PbO | 0–7 mol %. |

The preferred range of the sum total of MgO+CaO+SrO+BaO+ZnO+PbO is from 0 to 3.5 mol %.

According to a further aspect of the invention there is provided a protective cover for a gallium arsenide solar cell, the cover being made from a borosilicate glass composition according to the first aspect of the invention.

Typically, the thickness of such protective covers will be within the range 50 to 500 microns. The thickness of the glass sheet will partly be governed by the composition of the glass. For example, some compositions have a colouration which is too dark to be suitable for making glass sheet having a thickness at the upper region of the quoted thickness range.

We have found that for producing glass sheet which is thinner than about 100 microns the total amount of $CeO_2 + TiO_2$ (ceria + titania) needs to be high, typically greater than 1.5 mol %, to give the required UV absorption. However, many such compositions with more than 1.5% $CeO_2 + TiO_2$ will be coloured too darkly to be suitable for the thicker glass sheet (i.e. having a thickness above about 150 microns). These high UV absorbing glasses may be bleached to some extent by increasing the concentration of antimony oxide to value of above 0.3%, but maximum levels of $CeO_2 + TiO_2$ are not necessary for the thicker covers (i.e. above about 150 microns in thickness) and it would therefore also be possible to use $CeO_2 + TiO_2$ levels below 1.5% in these cases.

Bonding techniques that can be used for the glass compositions of the present invention are electrostatic bonding, teflon bonding and rigid adhesive bonding.

The present invention is illustrated by the following Examples. Table 1 shows the compositions in terms of mol percentages, whereas Table 2 shows the same compositions as Table 1, but the components in Table 2 are shown in weight percentages, based on the total weight of the glass composition.

The glass compositions in each of the examples exhibited a coefficient of linear expansion within the range 64 to $70 \times 10^{-7}$/deg.C.

In the following Tables:

CLE represents the coefficient of linear expansion of the glass composition measured at 20–550° C. ($\times 10^{-7}$/deg.C.), Tg represents the glass transition temperature (in °C., and Tw represents the working point (in °C.).

TABLE 1

| | 1 | 2 | 3 | 4 | 5 | 6 | 7 | 8 |
|---|---|---|---|---|---|---|---|---|
| $SiO_2$ | 75.0 | 69.2 | 73.2 | 69.3 | 64.3 | 76.8 | 75.9 | 67.6 |
| $Li_2O$ | 1.1 | | | | | | | |
| $Na_2O$ | 5.8 | 7.3 | 6.8 | 6.4 | 6.8 | 6.4 | 7.2 | 2.5 |
| $K_2O$ | 2.5 | 2.75 | 3.0 | 2.8 | 3.0 | 2.5 | 2.5 | 5.8 |
| MgO | 1.0 | | | | | | | |
| CaO | 1.0 | | | | | | | |
| SrO | | | | | | | | |
| BaO | 0.35 | 0.4 | | | | 0.9 | 0.9 | |
| ZnO | 2.25 | | | | | 2.4 | 2.4 | |
| PbO | | | 3.8 | 1.2 | 3.8 | | | |
| $Al_2O_3$ | 1.3 | 0.6 | 0.14 | 0.14 | 0.14 | 1.3 | 1.3 | |
| $B_2O_3$ | 7.5 | 18.5 | 11.1 | 18.1 | 20.3 | 8.0 | 8.0 | 22.6 |
| $Sb_2O_3$ | 0.15 | | | | | 0.1 | 0.1 | 0.25 |
| $CeO_2$ | 1.9 | 0.75 | 1.2 | 1.2 | 0.8 | 1.7 | 1.7 | 0.75 |
| $TiO_2$ | 0.25 | 0.4 | 0.9 | 0.8 | 0.9 | | | |
| $F_2$ | | | | | | | | 0.5 |
| Si + Al + B | 83.8 | 88.3 | 84.4 | 87.5 | 84.7 | 86.1 | 85.2 | 90.2 |
| CLE | 67.7 | 65.0 | 65.4 | 64.0 | 69.8 | 65.0 | 68.8 | 67.1 |
| Liquidus °C. | 1105 | 940 | 1055 | 1010 | 970 | 1080 | 1080 | 960 |
| Tg | 550 | 530 | 551 | 532 | 518 | 580 | 581 | 496 |
| Tw | 1105 | 950 | 970 | 948 | 880 | 1100 | 1083 | 975 |

| | 9 | 10 | 11 | 12 | 13 | 14 | 15 | 16 |
|---|---|---|---|---|---|---|---|---|
| $SiO_2$ | 68.2 | 75.8 | 67.5 | 75.3 | 68.3 | 67.1 | 67.7 | 66.2 |
| $Li_2O$ | | | | 1.1 | 1.1 | | | |
| $Na_2O$ | 2.7 | 6.4 | 2.1 | 6.1 | 2.6 | 2.2 | 2.0 | 2.1 |
| $K_2O$ | 6.4 | 2.4 | 5.9 | 2.1 | 6.4 | 6.6 | 6.5 | 6.5 |
| MgO | | | | | | | | |
| CaO | | | | | | | | |
| SrO | | | | | | | | |
| BaO | | 0.9 | | 0.9 | | | | |
| ZnO | | 2.4 | | 2.4 | | | | |
| PbO | | | | | | | | |
| $Al_2O_3$ | | 1.3 | | 1.3 | | | | |
| $B_2O_3$ | 21.7 | 8.0 | 22.7 | 8.0 | 20.7 | 22.1 | 21.8 | 22.4 |
| $Sb_2O_3$ | 0.2 | 0.1 | 0.2 | 0.1 | 0.2 | 0.2 | 0.2 | 0.2 |
| $CeO_2$ | 0.75 | 1.7 | 0.8 | 1.7 | 0.8 | 1.0 | 1.0 | 1.0 |
| $TiO_2$ | | | | | | | | 0.8 |
| $F_2$ | | 1.4 | 0.9 | 1.3 | | 0.9 | 0.9 | 0.7 |
| Si + Al + B | 89.9 | 85.1 | 90.2 | 84.6 | 89.0 | 89.2 | 89.5 | 88.6 |
| CLE | 68.1 | 67.1 | 67.2 | 67.5 | 66.7 | 68.9 | 67.5 | 68.0 |
| Liquidus °C. | 970 | 1075 | 960 | 1075 | 950 | 995 | 995 | 990 |
| Tg | 527 | 544 | 493 | 530 | 495 | 495 | 500 | |
| Tw | 970 | 1078 | 975 | 1050 | 955 | 960 | 965 | 955 |

| | 17 | 18 | 19 | 20 | 21 | 22 | 23 | 24 |
|---|---|---|---|---|---|---|---|---|
| $SiO_2$ | 65.3 | 64.8 | 61.9 | 62.8 | 65.4 | 64.6 | 63.8 | 73.0 |
| $Li_2O$ | | | | | | | | 1.1 |
| $Na_2O$ | 2.1 | 2.1 | 2.1 | 2.1 | 2.2 | 2.2 | 2.2 | 6.1 |
| $K_2O$ | 6.6 | 6.5 | 6.4 | 6.5 | 6.6 | 6.6 | 6.6 | 2.4 |
| MgO | | 1.6 | 4.9 | | | | | |
| CaO | | | | 3.5 | | | | 2.3 |
| SrO | | | | | 0.6 | 1.3 | 2.0 | |
| BaO | | | | | | | | 0.85 |
| ZnO | | | | | | | | 2.4 |
| PbO | | | | | | | | |
| $Al_2O_3$ | | | | | | | | 1.3 |
| $B_2O_3$ | 22.4 | 22.3 | 22.0 | 22.3 | 22.5 | 22.6 | 22.7 | 8.0 |
| $Sb_2O_3$ | 0.2 | 0.2 | 0.2 | 0.2 | 0.2 | 0.2 | 0.2 | 0.1 |
| $CeO_2$ | 1.0 | 0.95 | 0.95 | 0.95 | 1.0 | 1.0 | 1.0 | 1.7 |
| $TiO_2$ | 1.7 | 0.8 | 0.8 | 0.8 | 0.8 | 0.8 | 0.8 | |
| $F_2$ | 0.7 | 0.7 | 0.7 | 0.7 | 0.7 | 0.7 | 0.7 | 0.7 |
| Si + Al + B | 87.7 | 87.1 | 83.9 | 85.1 | 87.9 | 87.2 | 86.5 | 82.3 |
| CLE | 69.0 | 64.2 | 65.7 | 66.6 | 66.7 | 67.8 | 68.8 | 68.1 |
| Liquidus °C. | 990 | 995 | 1000 | 970 | 970 | 960 | 970 | 1090 |
| Tg | 504 | 505 | 528 | 551 | 523 | 527 | 545 | 532 |
| Tw | 945 | 948 | 933 | 925 | 950 | 940 | 940 | 1030 |

| | 25 | 26 | 27 | 28 | 29 | 30 | 31 | |
|---|---|---|---|---|---|---|---|---|
| $SiO_2$ | 75.7 | 62.1 | 57.9 | 72.1 | 73.8 | 75.7 | 70.6 | 73.6 |
| $Li_2O$ | 1.1 | | | | | 1.1 | | |
| $Na_2O$ | 6.3 | 2.2 | 2.2 | 4.8 | 6.2 | 7.0 | 3.3 | 6.8 |
| $K_2O$ | 2.5 | 6.6 | 5.4 | 3.2 | 3.0 | 2.5 | 7.2 | 3.0 |
| MgO | | 1.7 | | | | 1.0 | | |
| CaO | | | 1.2 | | | 1.0 | | |
| SrO | 1.3 | | | | | | | |
| BaO | 0.9 | | | | | 0.3 | | |
| ZnO | | | | | | 2.2 | | |
| PbO | | | | 6.7 | 3.7 | | 1.2 | 3.8 |
| $Al_2O_3$ | 1.3 | 2.0 | 8.2 | 0.15 | 0.14 | 1.3 | 0.13 | 0.14 |
| $B_2O_3$ | 8.3 | 22.5 | 23.4 | 10.8 | 10.0 | 4.6 | 15.54 | 10.1 |

TABLE 1-continued

| | | | | | | | | |
|---|---|---|---|---|---|---|---|---|
| Sb₂O₃ | 0.1 | 0.2 | 0.24 | | | 0.15 | | |
| CeO₂ | 1.8 | 1.0 | 1.0 | 1.3 | 1.2 | 1.9 | 1.2 | 1.6 |
| TiO₂ | | 0.8 | 0.4 | 0.9 | 0.9 | 0.2 | 0.85 | 0.9 |
| F₂ | 0.7 | 1.1 | | | 1.1 | 1.0 | | |
| Si + Al + B | 85.3 | 86.6 | 89.5 | 83.0 | 83.9 | 81.6 | 86.2 | 83.8 |
| CLE | 67.4 | 67.4 | | 67.7 | 68.7 | 67.7 | 67.3 | 68.7 |
| Liquidus °C. | 1070 | 980 | 1160 | 1020 | 1030 | 1040 | 1010 | 1040 |
| Tg | 539 | 506 | 504 | 530 | 532 | 545 | 545 | 542 |
| Tw | 1010 | 945 | 1090 | 977 | 970 | 1075 | 990 | 975 |

TABLE 2

| | 1 | 2 | 3 | 4 | 5 | 6 | 7 | 8 |
|---|---|---|---|---|---|---|---|---|
| SiO₂ | 69.3 | 64.5 | 62.8 | 62.8 | 54.8 | 70.1 | 69.3 | 62.0 |
| Li₂O | 0.5 | | | | | | | |
| Na₂O | 5.5 | 7.0 | 6.0 | 6.0 | 6.0 | 6.0 | 6.8 | 2.4 |
| K₂O | 3.6 | 4.0 | 4.0 | 4.0 | 4.0 | 3.5 | 3.5 | 8.4 |
| MgO | 0.6 | | | | | | | |
| CaO | 0.9 | | | | | | | |
| SrO | | | | | | | | |
| BaO | 0.8 | 1.0 | | | | 2.0 | 2.0 | |
| ZnO | 2.8 | | | | | 3.0 | 3.0 | |
| PbO | | | 12.0 | 4.0 | 12.0 | | | |
| Al₂O₃ | 2.0 | 1.0 | 0.2 | 0.2 | 0.2 | 2.0 | 2.0 | |
| B₂O₃ | 8.0 | 20.0 | 11.0 | 19.0 | 20.0 | 8.5 | 8.5 | 24.0 |
| Sb₂O₃ | 0.7 | | | | | 0.4 | 0.4 | 1.0 |
| CeO₂ | 5.0 | 2.0 | 3.0 | 3.0 | 2.0 | 4.5 | 4.5 | 2.0 |
| TiO₂ | 0.3 | 0.5 | 1.0 | 1.0 | 1.0 | | | |
| F₂ | | | | | | | | 0.3 |

| | 9 | 10 | 11 | 12 | 13 | 14 | 15 | 16 |
|---|---|---|---|---|---|---|---|---|
| SiO₂ | 62.3 | 69.5 | 62.2 | 69.2 | 62.8 | 61.2 | 61.8 | 60.1 |
| Li₂O | | | | 0.5 | 0.5 | | | |
| Na₂O | 2.5 | 6.0 | 2.0 | 5.8 | 2.5 | 2.1 | 1.9 | 2.0 |
| K₂O | 9.2 | 3.5 | 8.5 | 3.5 | 9.2 | 9.4 | 9.3 | 9.3 |
| MgO | | | | | | | | |
| CaO | | | | | | | | |
| SrO | | | | | | | | |
| BaO | | 2.0 | | 2.0 | | | | |
| ZnO | | 3.0 | | 3.0 | | | | |
| PbO | | | | | | | | |
| Al₂O₃ | | 2.0 | | 2.0 | | | | |
| B₂O₃ | 23.0 | 8.5 | 24.2 | 8.5 | 22.0 | 23.3 | 23.0 | 23.5 |
| Sb₂O₃ | 1.0 | 0.4 | 1.0 | 0.4 | 1.0 | 1.0 | 1.0 | 1.0 |
| CeO₂ | 2.0 | 4.5 | 2.0 | 4.5 | 2.0 | 2.5 | 2.5 | 2.5 |
| TiO₂ | | | | | | | | 1.0 |
| F₂ | | 0.6 | 0.5 | 0.6 | | 0.5 | 0.5 | 0.4 |

| | 17 | 18 | 19 | 20 | 21 | 22 | 23 | 24 |
|---|---|---|---|---|---|---|---|---|
| SiO₂ | 59.1 | 59.1 | 57.1 | 57.1 | 59.1 | 58.1 | 57.1 | 67.2 |
| Li₂O | | | | | | | | 0.5 |
| Na₂O | 2.0 | 2.0 | 2.0 | 2.0 | 2.0 | 2.0 | 2.0 | 5.8 |
| K₂O | 9.3 | 9.3 | 9.3 | 9.3 | 9.3 | 9.3 | 9.3 | 3.5 |
| MgO | | 1.0 | 3.0 | | | | | |
| CaO | | | | 3.0 | | | | 2.0 |
| SrO | | | | | 1.0 | 2.0 | 3.0 | |
| BaO | | | | | | | | 2.0 |
| ZnO | | | | | | | | 3.0 |
| PbO | | | | | | | | |
| Al₂O₃ | | | | | | | | 2.0 |
| B₂O₃ | 23.5 | 23.5 | 23.5 | 23.5 | 23.5 | 23.5 | 23.5 | 8.5 |
| Sb₂O₃ | 1.0 | 1.0 | 1.0 | 1.0 | 1.0 | 1.0 | 1.0 | 0.4 |
| CeO₂ | 2.5 | 2.5 | 2.5 | 2.5 | 2.5 | 2.5 | 2.5 | 4.5 |
| TiO₂ | 2.0 | 1.0 | 1.0 | 1.0 | 1.0 | 1.0 | 1.0 | |
| F₂ | 0.4 | 0.4 | 0.4 | 0.4 | 0.4 | 0.4 | 0.4 | 0.4 |

| | 25 | 26 | 27 | 28 | 29 | 30 | 31 | 32 |
|---|---|---|---|---|---|---|---|---|
| SiO₂ | 67.2 | 56.1 | 50.2 | 67.8 | 63.7 | 70.5 | 62.8 | 62.8 |
| Li₂O | 0.5 | | | | | 0.5 | | |
| Na₂O | 5.8 | 2.0 | 2.0 | 4.0 | 5.5 | 6.7 | 3.0 | 6.0 |
| K₂O | 3.5 | 9.3 | 7.3 | 4.0 | 4.0 | 3.6 | 10.0 | 4.0 |
| MgO | | 1.0 | | | | 0.6 | | |
| CaO | | | 1.0 | | | 0.9 | | |
| SrO | 2.0 | | | | | | | |
| BaO | 2.0 | | | | | 0.8 | | |
| ZnO | 3.0 | | | | | 2.8 | | |
| PbO | | | | 20.0 | 12.0 | | 4.0 | 12.0 |
| Al₂O₃ | 2.0 | 3.0 | 12.0 | 0.2 | 0.2 | 2.0 | 0.2 | 0.2 |
| B₂O₃ | 8.5 | 23.5 | 23.5 | 10.0 | 10.0 | 5.0 | 16.0 | 10.0 |
| Sb₂O₃ | 0.4 | 1.0 | 1.0 | | | 0.7 | | |
| CeO₂ | 4.5 | 2.5 | 2.5 | 3.0 | 3.0 | 5.0 | 3.0 | 4.0 |

TABLE 2-continued

| TiO₂ | | 1.0 | 0.5 | 1.0 | 1.0 | 0.3 | 1.0 | 1.0 |
|---|---|---|---|---|---|---|---|---|
| F₂ | 0.4 | 0.6 | | | 0.6 | 0.6 | | |

We claim:

1. A borosilicate glass composition characterised in that the glass composition consists essentially of the following components:

| SiO₂ | 57–77 mol %, |
|---|---|
| Al₂O₃ | 0–8.5 mol %, |
| B₂O₃ | 4.6–23.0 mol %, | the total amount of SiO₂ + Al₂O₃ + B₂O₃ being from 81 to 91 mol %,

| Li₂O | 0–1.5 mol %, |
|---|---|
| Na₂O | 2–7.5 mol %, |
| K₂O | 2–7.5 mol %, | the total amount of Li₂O + Na₂O + K₂O being from 7.6 to 10.6 mol %,

| CeO₂ | 0.7–2.0 mol %, |
|---|---|
| Sb₂O₃ | 0–0.3 mol %, |
| As₂O₃ | 0–0.3 mol %, |
| TiO₂ | 0–2.0 mol %, |
| F₂ | 0–2.0 mol %, | and one or more of MgO, CaO, SrO, BaO, ZnO and PbO, in a total amount of from 0 to 7 mol %;
and in that the glass composition exhibits a coefficient of linear expansion within the range 64.0–70.0×10⁻⁷/deg.C.

2. A glass composition according to claim 1, wherein the amounts of SiO₂, Al₂O₃ and B₂O₃ fall in the following ranges:

| SiO₂ | 65–70 mol %, |
|---|---|
| Al₂O₃ | 0–2 mol %, |
| B₂O₃ | 8–22 mol %. |

3. A glass composition according to claim 1, wherein the amount of MgO is from 0 to 5 mol %.

4. A glass composition according to claim 1, wherein the amount of CaO is from 0 to 3.5 mol %.

5. A glass composition according to claim 1, wherein the amount of SrO is from 0 to 2 mol %.

6. A glass composition according to claim 1, wherein the amount of BaO is from 0 to 2 mol %.

7. A glass composition according to claim 1, wherein the amount of ZnO is from 0 to 2.5 mol %.

8. A glass composition according to claim 1, wherein the amount of PbO is from 0 to 7 mol %.

9. A glass composition according to claim 1, wherein the sum total of MgO + CaO + SrO + BaO + ZnO + PbO is from 0 to 3.5 mol %.

10. A protective cover for a gallium arsenide solar cell, the said cover being made from a borosilicate glass composition, said composition consisting essentially of the following components:

| SiO₂ | 57–77 mol %, |
|---|---|
| Al₂O₃ | 0–8.5 mol %, |

| | |
|---|---|
| B₂O₃ | 4.6–23.0 mol %, | the total amount of SiO₂+Al₂O₃+B₂O₃ being from 81 to 91 mol %,

| | |
|---|---|
| Li₂O | 0–1.5 mol %, |
| Na₂O | 2–7.5 mol %, |
| K₂O | 2–7.5 mol %, | the total amount of Li₂O+Na₂O+K₂O being from 7.6 to 10.6 mol %,

| | |
|---|---|
| CeO₂ | 0.7–2.0 mol %, |
| Sb₂O₃ | 0–0.3 mol %, |
| As₂O₃ | 0–0.3 mol %, |
| TiO₂ | 0–2.0 mol %, |
| F₂ | 0–2.0 mol %, | and one or more of MgO, CaO, SrO, BaO, ZnO and PbO, in a total amount of from 0 to 7 mol %;

and the said glass composition having a coefficient of linear expansion within the range $64.0$–$70.0 \times 10^{-7}$/deg.C.

* * * * *